(12) United States Patent
Chang et al.

(10) Patent No.: US 7,145,234 B2
(45) Date of Patent: Dec. 5, 2006

(54) CIRCUIT CARRIER AND PACKAGE STRUCTURE THEREOF

(75) Inventors: Kenny Chang, Hsin-Tien (TW); Chi-Hsing Hsu, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 14 days.

(21) Appl. No.: 11/036,111

(22) Filed: Jan. 14, 2005

(65) Prior Publication Data

US 2005/0167815 A1    Aug. 4, 2005

(30) Foreign Application Priority Data

Jan. 15, 2004   (TW) ............................... 93100984 A
Jul. 29, 2004   (TW) ............................... 93122693 A

(51) Int. Cl.
*H01L 23/48*    (2006.01)
*H01L 23/34*    (2006.01)

(52) U.S. Cl. .................. 257/734; 257/724; 257/924; 257/E21.008; 257/E21.004; 257/923

(58) Field of Classification Search ............... 257/723, 257/724, 923, 924, E21.004, E21.008
See application file for complete search history.

(56) References Cited

U.S. PATENT DOCUMENTS

| | | | |
|---|---|---|---|
| 6,521,997 B1 * | 2/2003 | Huang et al. ............... | 257/737 |
| 6,603,210 B1 * | 8/2003 | Kishimoto et al. ......... | 257/781 |
| 6,838,763 B1 * | 1/2005 | Ahn et al. .................. | 257/698 |
| 6,889,155 B1 * | 5/2005 | Ogino et al. ................ | 702/113 |
| 2003/0151135 A1 * | 8/2003 | Sakamoto et al. .......... | 257/723 |
| 2004/0166608 A1 * | 8/2004 | Nakamura .................. | 438/118 |

FOREIGN PATENT DOCUMENTS

| | | |
|---|---|---|
| TW | 523857 | 3/2003 |
| TW | 533555 | 5/2003 |

\* cited by examiner

*Primary Examiner*—Jasmine Clark
(74) *Attorney, Agent, or Firm*—J.C. Patents

(57) ABSTRACT

A circuit carrier and a package structure thereof are provided. The circuit carrier comprises a substrate having a surface, a plurality of passive component electrode pads or a plurality of passive component electrode planes on the surface of the substrate for electrically connecting a passive component corresponding to the plurality of passive component electrode pads, and a solder mask layer covering the surface of the substrate and including at least a solder mask opening, that entirely exposing the passive component electrode pads or a portion of the surface of each the passive component electrode plane corresponding to the passive component. Because there is no solder mask layer between the bottom of the passive component and the substrate, the gap between the passive component and the substrate will become wider. Hence, remaining flux can be entirely removed in order to increase the yield rate of the subsequent high temperature process.

20 Claims, 9 Drawing Sheets

US 7,145,234 B2

CIRCUIT CARRIER AND PACKAGE STRUCTURE THEREOF

CROSS-REFERENCE TO RELATED APPLICATION

This application claims the priority benefit of Taiwan application serial no. 93100984, filed on Jan. 15, 2004.

BACKGROUND OF THE INVENTION

1. Field of the Invention

This invention generally relates to a circuit carrier and a package structure thereof, and more particularly to a circuit carrier and a package structure thereof with passive component electrode pads or passive component electrode planes.

2. Description of Related Art

As the electronic technology advances, high technology industries have evolved. Accordingly, more and more electronic products are being developed and are heading towards compact designs. Currently, a circuit carrier, such as PCB or chip carrier, is a widely used component in circuit layout. A widely used circuit carrier is a lamination of a plurality of patterned circuit layers and a plurality of dielectric layers that alternately layout. The dielectric layer is between two adjacent patterned circuit layers. The patterned circuit layers are electrically connected through the plated through holes (PTH) or vias. Because the circuit carrier has the advantages of high layout density, compact assembly and good performance, it has been widely used in package structures. In addition, when the signals are transmitted inside the circuit carrier, the passive components such as capacitors can be disposed on the circuit carrier to effectively refrain from the coupling inductance and to reduce the cross talk when the signals switch to different states, which maintain the signal transmission quality.

FIG. 1A is the top view of a conventional circuit carrier with electronic devices. Referring to FIG. 1A, the circuit carrier 100 includes a plurality of electronic devices 104 and 130 on the surface of a substrate 110. The device 104, for example, is a chip, which is disposed on the die connecting area 104a of the substrate 110. The device 130, for example, is a passive component such as capacitor, inductor or resistor, which is disposed on the passive component connecting area 130a of the substrate 110.

FIG. 1B is a top view of the passive component connecting area of FIG. 1A. FIG. 1C is the cross-sectional view of the circuit carrier with the passive component along the I–I' line of FIG. 1A. In FIG. 1B, the passive component electrode pads 112 and 114 are disposed on the surface of the passive component connecting area 130a and consist of the outermost patterned circuit layer (not shown). A solder mask layer 120 covers the surface of the substrate 110 and has a plurality of first solder mask openings 122a and 122b. The first solder mask openings 122a and 122b respectively expose a portion of the surface of the corresponding passive component electrode pads 112 and 114 in order to form the solder mask defined (SMD) passive component electrode pads. The passive component electrode pads 112 and 114 can be used for the circuit carrier 100 to electrically connect a passive component 130.

Referring to FIG. 1C, the passive component 130 includes a plurality of electrodes 132 and 134 whose surfaces are electrically and structurally connected to the passive component electrode pads 112 and 114 via the solders 124 and 126. Further, a flux can be used to enhance the connection between the solders 124 and 126 and the passive component electrode pads 112 and 114. In addition, after the passive component 130 is disposed on the circuit carrier 100, the remaining flux on the circuit carrier 100 can be removed by a cleaning step. Then an encapsulant 128 covers the surface of the passive component 130 to form a package structure 102.

In FIG. 1C, because the passive component 130 crosses over from the circuit carrier 110 to the passive component electrode pads 112 and 114, and the gap 108 between the passive component 130 and the solder mask layer 120 is very narrow, the remaining flux in the gap 108 between the passive component 130 and the solder mask layer 120 can not be effectively removed. In addition, the encapsulant 128 also cannot be filled into the gap 108. Hence, if a subsequent high temperature process such as reflow process is applied to the circuit carrier 100 with the passive component 130, the solders 124 and 126 may flow into the gap 109 (between the encapsulant 128 and the solder mask layer 120) below the passive component 130, which will short-circuit the passive component electrode pads 112 and 114 and make the passive component ineffective. This is so-called solder bridge issue.

To resolve the this problem, the conventional art forms a second solder mask opening with a long but narrow shape (not shown) on the solder mask layer 120 between the passive component electrode pads 112 and 114 to effectively remove the flux remaining between the passive component 130 and the solder mask layer 120, which further reduces the possibility that the solders 124 and 126 flow into the gap 109. In addition, because the second solder mask opening can increase the length of the gap 109 along the passive component electrode pads 112 and 114, it would make it more difficult to connect the solders 124 and 126 even if the solders 124 and 126 flow into the gap 109. However, because the distance between the second solder mask opening and the other mask openings 122a and 122b is pretty short, manufacturing equipment with further preciseness is required to form the second solder mask opening, which increases the cost of the circuit carrier 110. Further, when the pitch D between the passive component electrode pads 112 and 114 tends toward the find pitch, it is more difficult to form the narrow-but-long second solder mask opening, or even makes the pitch D between the passive component electrode pads 112 and 114 not wide enough to form the second solder mask opening. Therefore, a new solution is desired for the second solder mask opening to avoid the solder bridge issue that causes the ineffectiveness of the passive component 130.

SUMMARY OF THE INVENTION

The present invention is directed to a circuit carrier to improve the solder bridge issue generated after the passive component is soldered to the circuit carrier.

The present invention is also directed to a package structure to improve the solder bridge issue generated after the passive component is soldered to the circuit carrier.

According to an embodiment of the present invention, a circuit carrier for carrying at least a passive component having a plurality of electrodes is provided. The circuit carrier comprises a substrate having a surface; a plurality of passive component electrode pads formed on the surface of the substrate, wherein each passive component is electrically connected to a corresponding passive component electrode pad; and a solder mask layer covering the surface of the substrate, wherein the solder mask layer includes at least a solder mask opening, which exposes the entire passive component electrode pads corresponding to the passive component.

According to another embodiment of the present invention, a circuit carrier for carrying at least a passive component having a plurality of electrodes comprises a substrate having a surface; a plurality of passive component electrode planes, formed on the surface of the substrate, wherein each passive component is electrically connected to a corresponding passive component electrode plane; and a solder mask layer, covering the surface of the substrate, wherein the solder mask layer including at least a solder mask opening exposing a portion of the surface of each of the plurality of passive component electrode planes corresponding to the passive component.

In light of the above, because there is no solder mask layer between the passive component and the substrate, a larger gap is formed. Hence, after the electrodes of the passive component are soldered to the passive component electrode pads or planes, the remaining flux between the passive component and the substrate can be easily removed, and the encapsulant can be easily filled into the third solder mask opening. Therefore, the solder bridge issue after the subsequent high temperature process can be reduced and the yield rate can be therefore increased.

The above is a brief description of some deficiencies in the prior art and advantages of the present invention. Other features, advantages and embodiments of the invention will be apparent to those skilled in the art from the following description, accompanying drawings and appended claims.

DESCRIPTION OF THE EMBODIMENTS

Figure 1A:
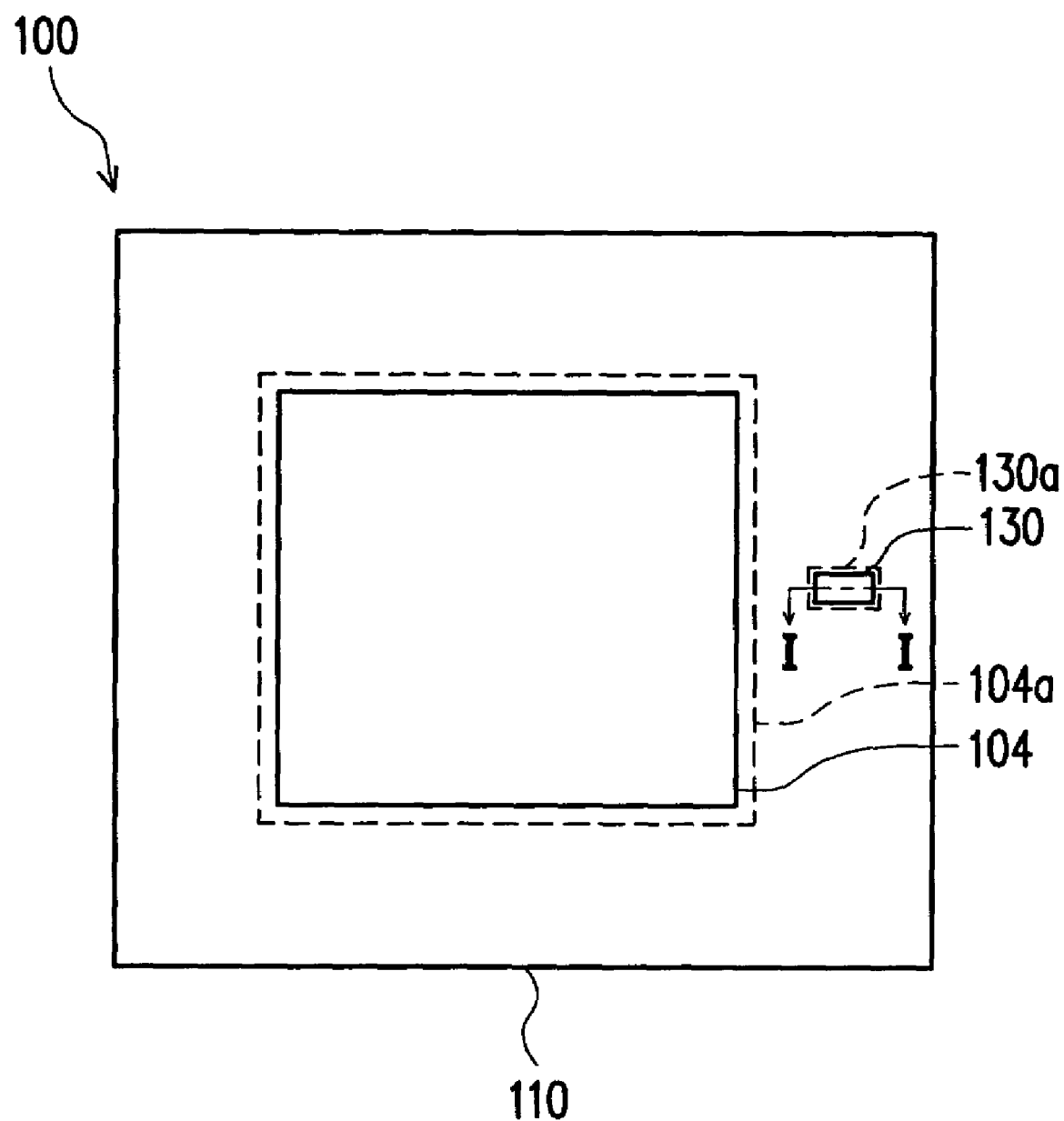
FIG. 1A is the top view of a conventional circuit carrier with electronic devices.
Figure 1B:
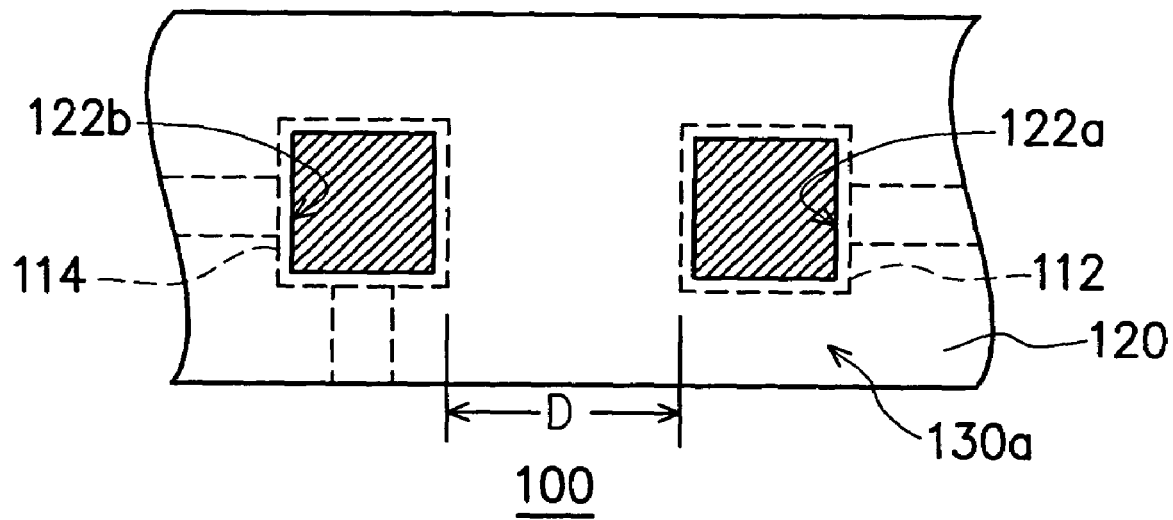
FIG. 1B is the top view of the passive component connecting area of FIG. 1A.
Figure 1C:
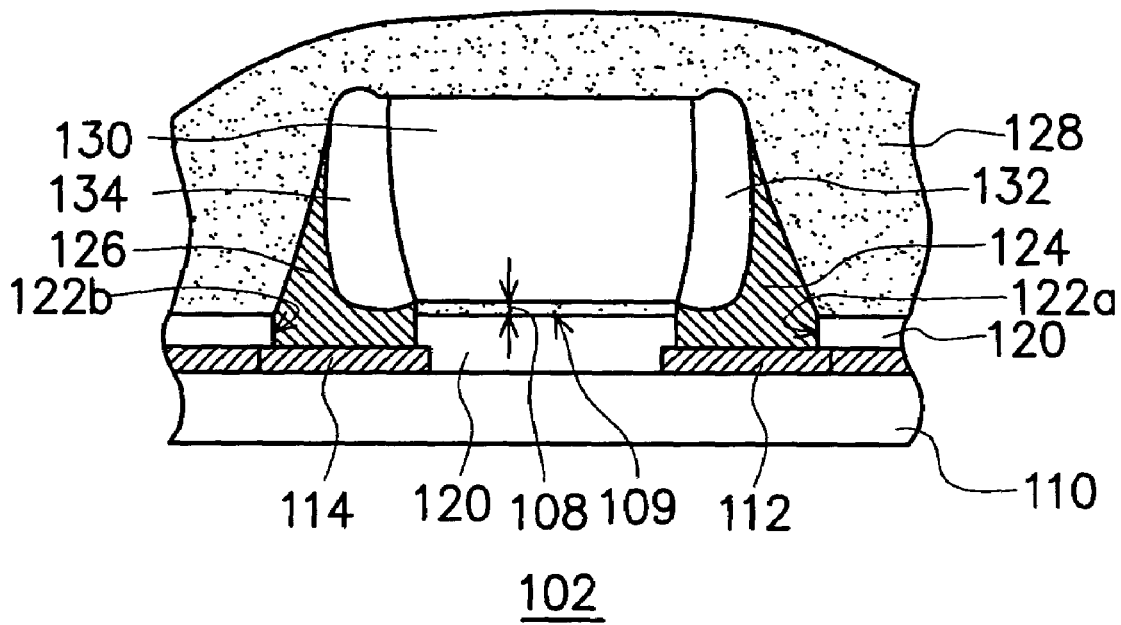
FIG. 1C is the cross-sectional view of the circuit carrier with the passive component along the I—I line of FIG. 1A.
Figure 2A:
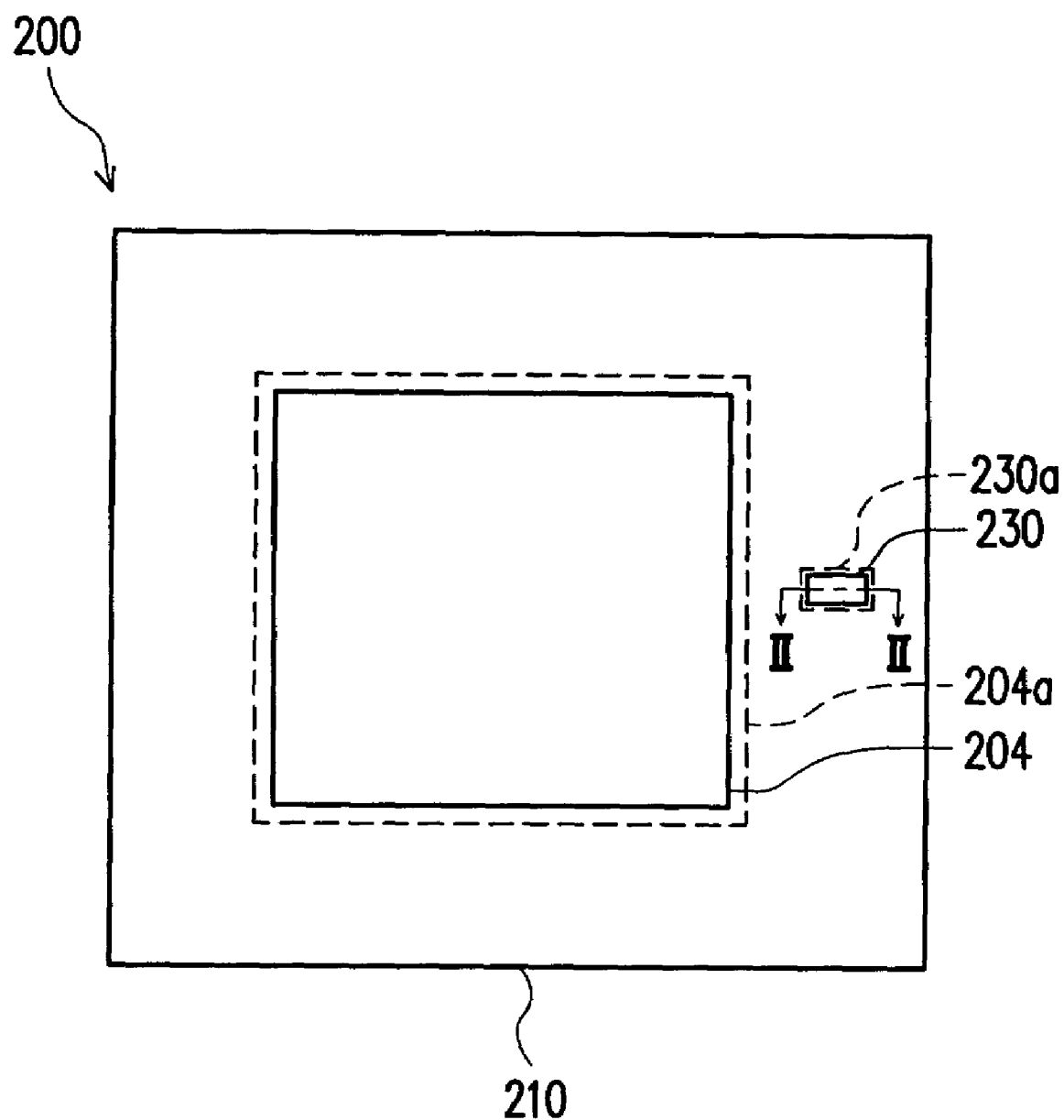
FIG. 2A is the top view of a circuit carrier with the electronic device in accordance with a first embodiment of the present invention.

FIG. 2A is the top view of a circuit carrier with the electronic device in accordance with an first embodiment of the present invention. Referring to FIG. 2A, the circuit carrier 200 includes a plurality of electronic devices 204 and 230 on the surface of a substrate 210. The device 204, for example, is an active IC chip, which is disposed on the die connecting area 204a of the substrate 210. The device 230 for example is a passive component such as a capacitor, an inductor or a resistor, which is disposed on the passive component connecting area 230a of the substrate 210. In the first embodiment, the passive component connecting area 230a and the die connecting area 204a are on the top surface of the substrate 210. The passive component connecting area 230a also can be formed on the bottom surface of the substrate 210 (not shown), and on the different surface from said die connecting area 204a. Further, the substrate 210 can include a plurality of passive components. In the first embodiment, only one passive component 230 is used to illustrate the present invention.

Figure 2B:
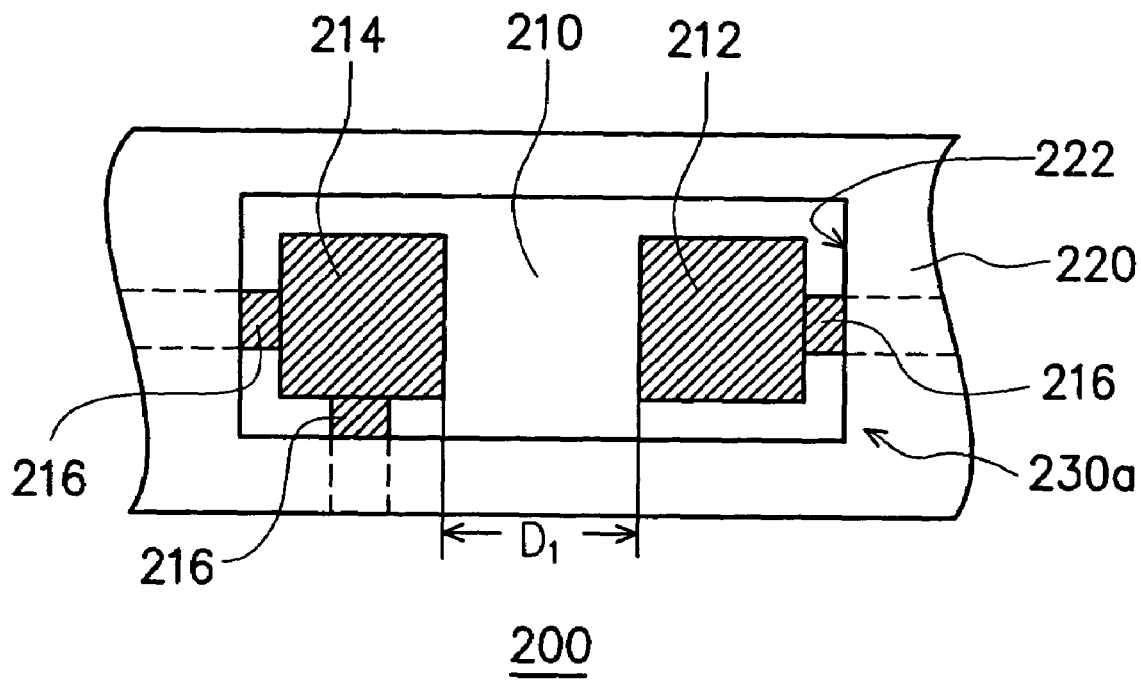
FIG. 2B is the top view of a circuit carrier in accordance with the first embodiment of the present invention.

FIG. 2B is a top view of a circuit carrier in accordance with the first embodiment of the present invention. The circuit carrier 200 includes a substrate 210, a first passive component electrode pad 212, a second passive component electrode pad 214 and a solder mask layer 220. The first and second passive component electrode pads 212 and 214 are disposed on the surface of the substrate 210 and are placed within the passive component connecting area 230a. The solder mask layer 220 covers the surface of the substrate 210 and includes a solder mask opening 222. The solder mask opening 222 exposes the entire surface of the corresponding passive component electrode pads 212 and 214. It should be noted that to avoid the non-uniformity exposure of the area of the passive component electrode pads 212 and 214 due to the limitation of the alignment preciseness, the edge of the solder mask opening 222 can be extended to the outside of the passive component electrode pads 212 and 214 exposing a portion of the circuit 216 which is disposed on the surface of the substrate 210 and connected to the passive component electrode pads 212 and 214. Hence, the manufacturing equipment with less alignment preciseness can be used to form the solder mask opening 222. Further, in the present invention, each passive component corresponds to one solder mask opening.

In addition, as shown in FIG. 2B, when the pitch D1 between the passive component electrode pads 212 and 214 tends toward the fine pitch, the manufacturing equipment with less alignment preciseness can be used to form the solder mask opening 222. Hence, the fine pitch D1 will not influence the process of forming the solder mask opening 222. The manufacturing equipment with high alignment preciseness can be used to form the solder mask opening 222.

Figure 2C:
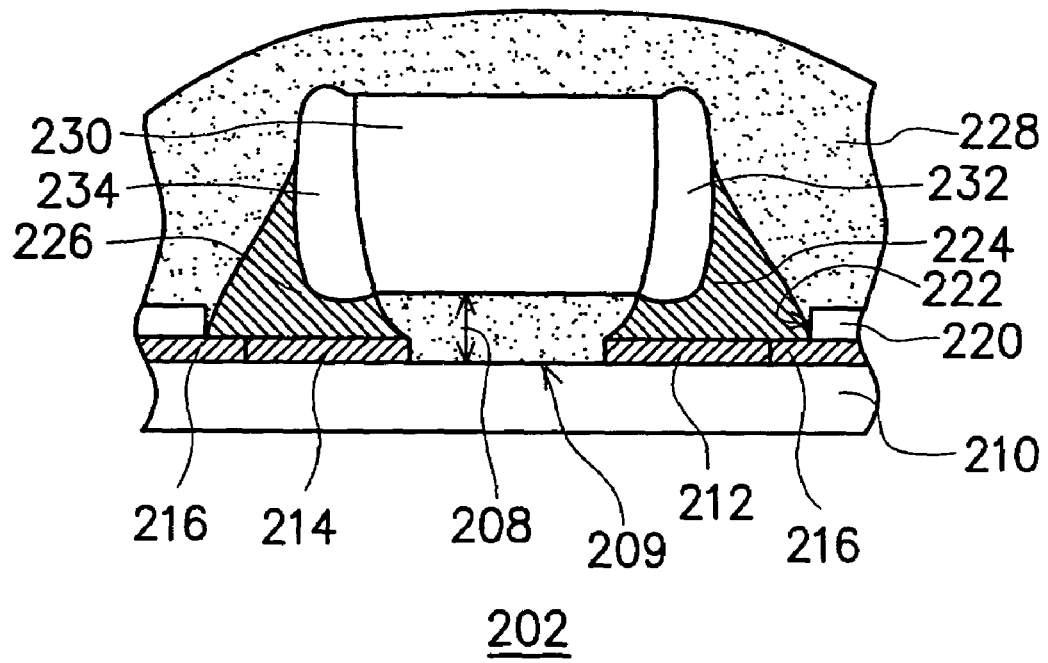
FIG. 2C is the cross-sectional view of the circuit carrier with the passive component along the II—II line of FIG. 2A.

FIG. 2C is a cross-sectional view of the circuit carrier with the passive component along the II—II line of FIG. 2A. In the first embodiment, the passive component 230 includes a first and second electrodes 232 and 234 within the solder mask opening 222. The surfaces of the first and the second electrodes 232 and 234 are electrically and structurally connected to the corresponding passive component electrode pads 212 and 214 via the solders 224 and 226. Further, a flux can be used to enhance the connection between the solders 224 and 226 and the passive component electrode pads 212 and 214. In addition, after the passive component 230 is disposed on the circuit carrier 200, the remaining flux on the circuit carrier 200 can be removed by a cleaning step.

Then an encapsulant 228 covers the surface of the active component 204 and/or the passive component 230 to form a package structure 202.

It should be noted that in FIG. 2C after the electrodes 232 and 234 are electrically and structurally connected to the corresponding passive component electrode pads 212 and 214 via the solders 224 and 226, because there is no solder mask layer between the passive component 230 and the substrate 210, the gap 208 between the passive component 230 and the substrate 210 will become wider. Hence, it will be more easily to remove the remaining flux during the cleaning step so that the remaining flux will not stay in between the passive component 230 and the substrate 210. In addition, during the subsequent high temperature process such as reflow process, the entry of the solders 224 and 226 into the gap 209 will be more difficult, and therefore the yield rate can be increased.

Figure 2D:
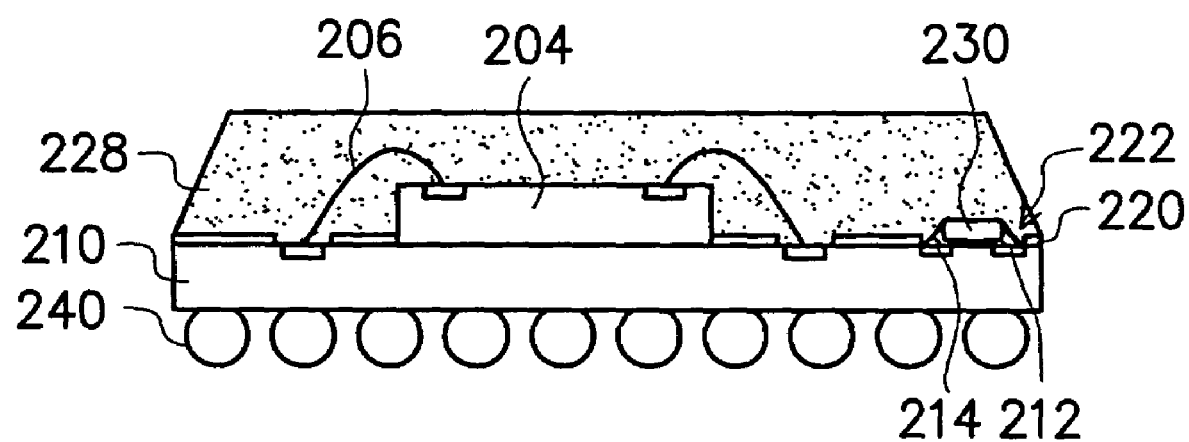
FIG. 2D is the cross-sectional view of a package structure in accordance with the first embodiment of the present invention.

FIG. 2D is a cross-sectional view of a package structure in accordance with the first embodiment of the present invention. The package structure 202 includes a package substrate 210, at least an active component 204, at least a passive component 230, a plurality of passive component electrode pads 212 and 214, and a solder mask layer 220. The passive component electrode pad 212 and 214 are disposed on the surface of the substrate 210 for electrically connecting the corresponding passive component 230. In addition, the active device 204, for example, is electrically connected to the substrate 210 by a plurality of wires 206 or by a flip chip. The passive component 230 is on the surface of the package substrate 210 and each passive component 230 has a plurality of electrodes 232 and 234. The solder mask layer 220 covers the surface of the package substrate 210 and includes a solder mask opening 222. The solder mask opening 222 exposes the entire surface of the corresponding passive component electrode pads 212 and 214. Then an encapsulant 228 is formed to cover the surface of the active component 204 and/or the passive component 230 to complete a package structure 202. The bottom surface of the package substrate 210 can further comprise a plurality of solder balls 240 to connect the external device (not shown) forming a ball grid array (BGA) package structure 202.

Figure 3A:
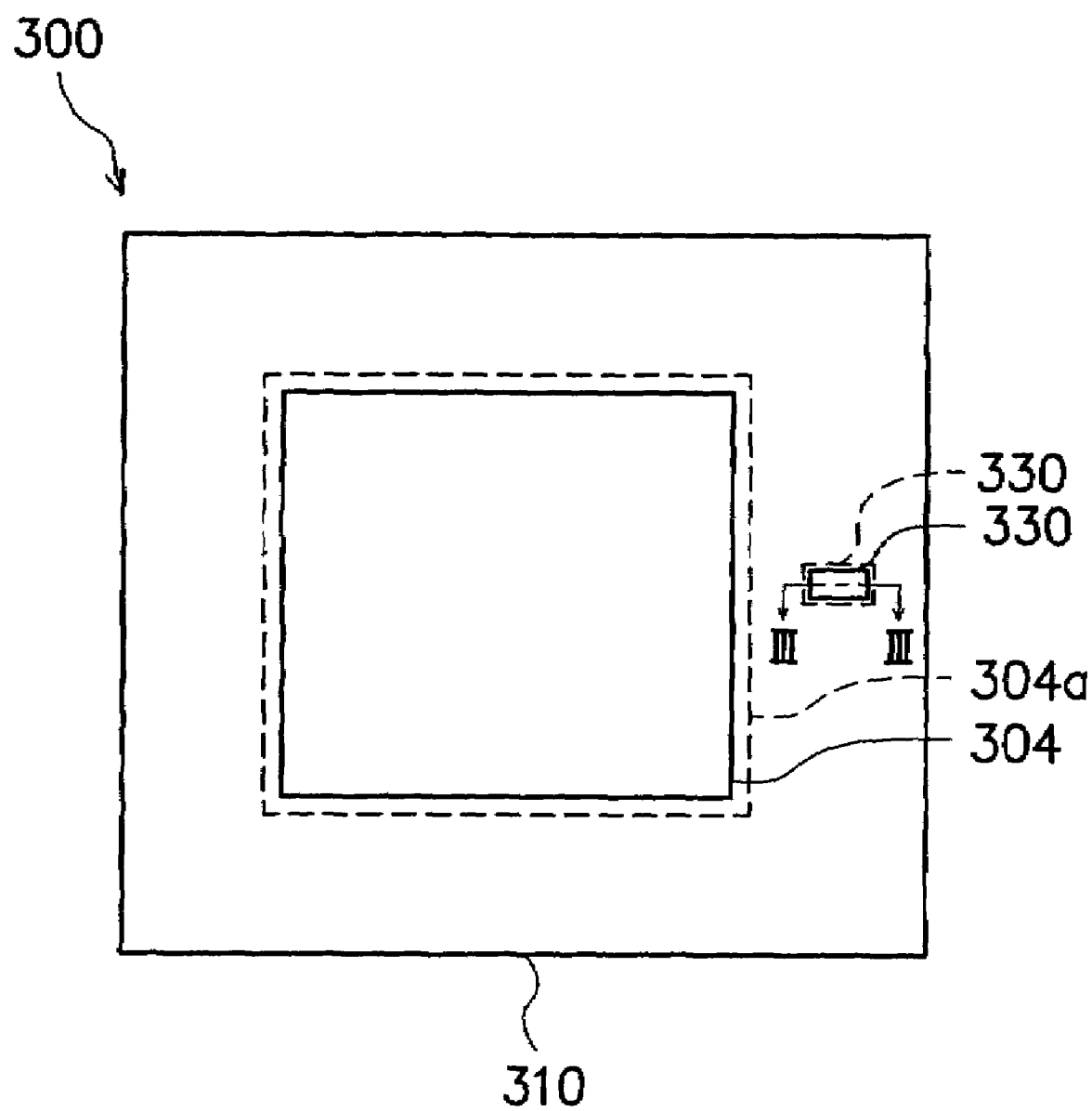
FIG. 3A is the top view of a circuit carrier with the electronic device in accordance with a second embodiment of the present invention.

FIG. 3A is the top view of a circuit carrier with the electronic device in accordance with a second embodiment of the present invention. Referring to FIG. 3A, the circuit carrier 300 includes a plurality of electronic devices 304 and 330 on the surface of a substrate 310. The device 304, for example, is an active IC chip, which is disposed on the die connecting area 304a of the substrate 310. The device 330 for example is a passive component such as a capacitor, an inductor or a resistor, which is disposed on the passive component connecting area 330a of the substrate 310. In the second embodiment, the passive component connecting area 330a and the die connecting area 304a are on the top surface of the substrate 310. The passive component connecting area 330a also can be formed on the bottom surface of the substrate 310 (not shown), and on the different surface from said die connecting area 304a. Further, the substrate 310 can include a plurality of passive components. In the second embodiment, only one passive component 330 is used to illustrate the present invention.

Figure 3B:
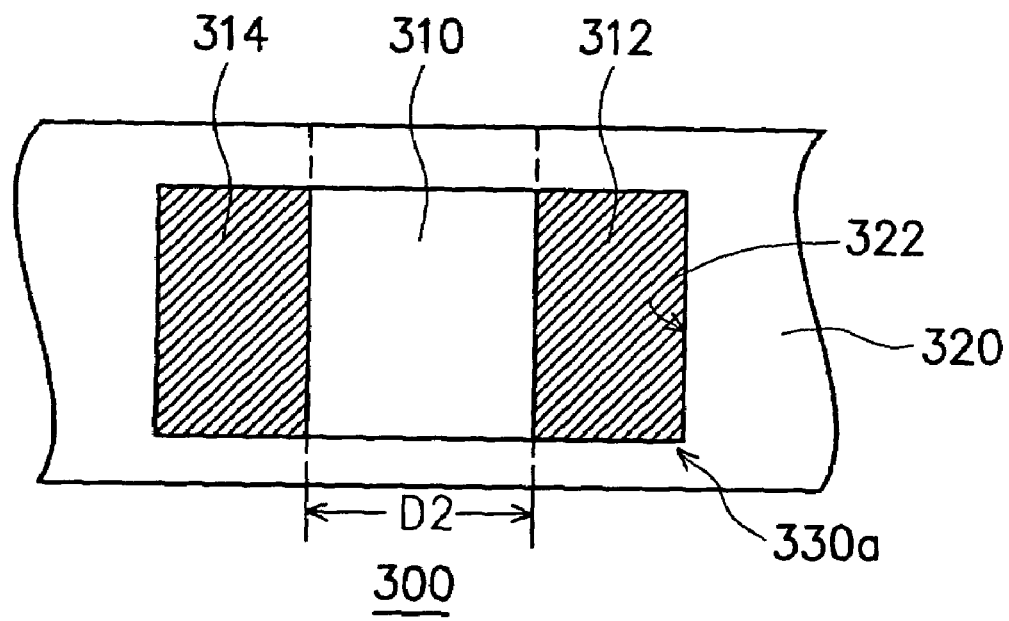
FIG. 3B is the top view of a circuit carrier in accordance with the second embodiment of the present invention.

FIG. 3B is a top view of a circuit carrier in accordance with the second embodiment of the present invention. The circuit carrier 300 includes a substrate 310, a first passive component electrode plane 312, a second passive component electrode plane 314 and a solder mask layer 320. The first and second passive component electrode planes 312 and 314, such as a power plane and a ground plane, are disposed on the same surface of the substrate 310 and extend within the passive component connecting area 330a. The solder mask layer 320 covers the surface of the substrate 310 and includes a solder mask opening 322. The solder mask opening 322 exposes a portion of the surface of each of the passive component electrode planes 312 and 314. It should be noted that if the exposed area of the passive component electrode plane 312 due to the limitation of the alignment preciseness is not equal to that of the passive component electrode plane 314, the manufacturing equipment with high alignment preciseness can be used to form the solder mask opening 322. Similar to the first embodiment, each passive component corresponds to one solder mask opening.

In addition, as shown in FIG. 3B, when the pitch D2 between the passive component electrode planes 312 and 314 tends toward the fine pitch, the manufacturing equipment with less alignment preciseness can be used to form the solder mask opening 322. Hence, the fine pitch D2 will not influence the process of forming the solder mask opening 322. The manufacturing equipment with high alignment preciseness can be used to form the solder mask opening 322.

Figure 3C:
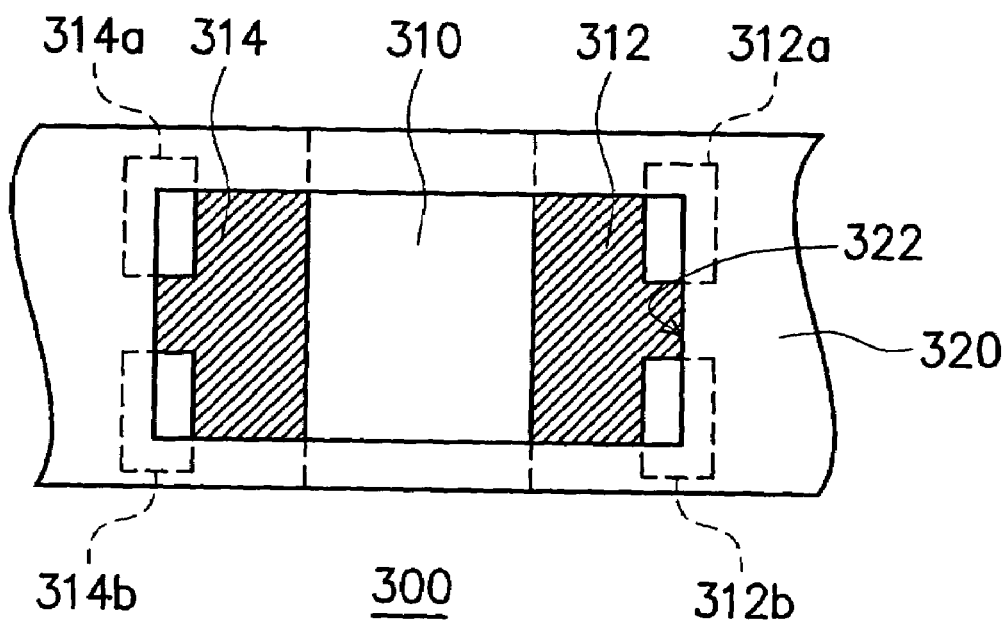
FIGS. 3C and 3D are the top views of another two examples of the second embodiment of the present invention.
Figure 3D:
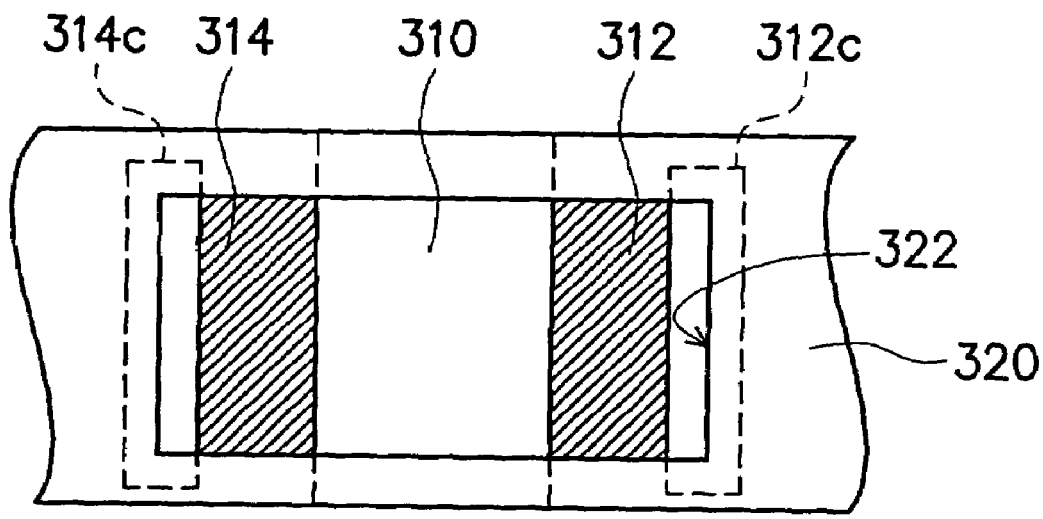

FIGS. 3C and 3D are the top views of another two examples of the second embodiment of the present invention. Refer to FIGS. 3C and 3D, the passive component with two electrodes is illustrated for example. The first and the second passive component electrode planes 312 and 314 are disposed on the surface of the substrate 310. The solder mask layer 320 covers the surface of the substrate 310, and has a passive component solder mask opening 322. The solder mask opening 322 exposes a portion of the surface of each of the first and the second passive component electrode planes 312 and 314. Comparing to the structure in FIG. 3B, in order to avoid that the exposed area of the passive component electrode plane 312 is not equal to that of the passive component electrode plane 314 due to the limitation of the alignment preciseness, the first passive component electrode planes 312 has two openings 312a and 312b while the second passive component electrode planes 314 has two openings 314a and 314b, as shown in FIG. 3C. The openings 312a, 312b, 314a and 314b are located at the corners of the solder mask opening 322. Therefore, the exposed area of the first passive component electrode plane 312 is T-shaped with the openings 312a and 312b, while the exposed area of the second passive component electrode plane 314 is T-shaped with the openings 314a and 314b. In addition, refer to FIG. 3D, the first passive component electrode plane 312 has an opening 312c, and the second passive component electrode plane 314 has an opening 314c. The longitudinal direction of the openings 312c and 314c are substantially parallel to the width direction of the solder mask opening 322. The length of the openings 312c and 314c are greater than the width of the solder mask opening 322. Therefore, the exposed areas of the first and second passive component electrode planes 312 and 314 become less due to the openings 312c and 314c.

Figure 3E:
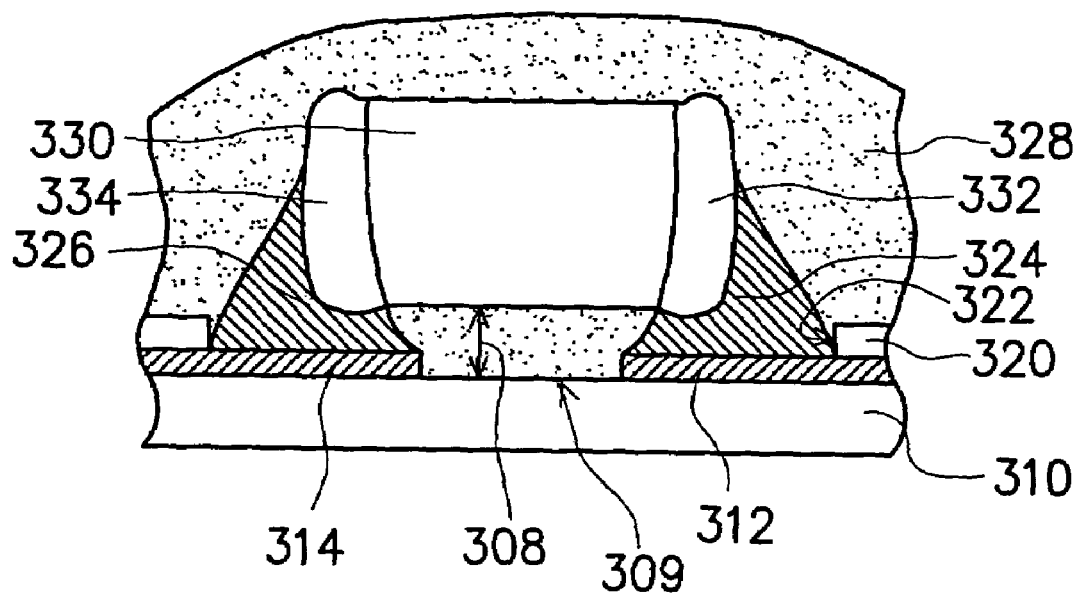
FIG. 3E is the cross-sectional view of the circuit carrier with the passive component along the III—III line of FIG. 3A.

FIG. 3E is a cross-sectional view of the circuit carrier with the passive component along the III—III line of FIG. 3A. In the second embodiment, the passive component 330 includes a first and second electrodes 332 and 334 within the solder mask opening 322. The surfaces of the first and the second electrodes 332 and 334 are electrically and structurally connected to the corresponding passive component electrode planes 312 and 314 via the solders 324 and 326. Further, a flux can be used to enhance the connection between the solders 324 and 326 and the passive component electrode planes 312 and 314. In addition, after the passive component 330 is disposed on the circuit carrier 300, the remaining flux on the circuit carrier 300 can be removed by a cleaning step. Then an encapsulant 328 covers the surface of the active component 304 and/or the passive component 330 to form a package structure 302.

It should be noted that in FIG. 3E after the electrodes 332 and 334 are electrically and structurally connected to the corresponding passive component electrode planes 312 and 314 via the solders 324 and 326, because there is no solder mask layer between the passive component 330 and the substrate 310, the gap 308 between the passive component 330 and the substrate 310 will become wider. Hence, it will be more easily to remove the remaining flux during the cleaning step so that the remaining flux will not stay in between the passive component 330 and the substrate 310. In addition, during the subsequent high temperature process such as reflow process, the entry of the solders 324 and 326 into the gap 309 will be more difficult, and therefore the yield rate can be increased.

Figure 3F:
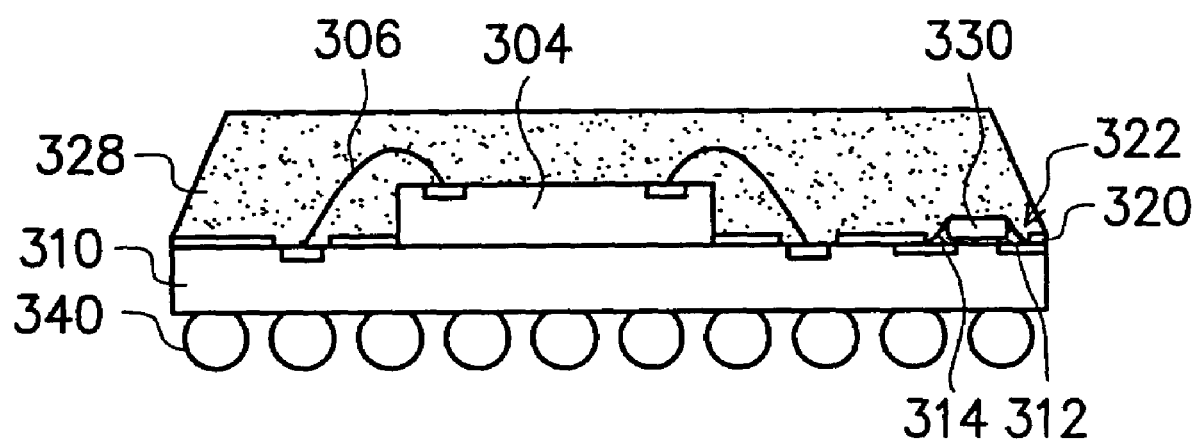
FIG. 3F is the cross-sectional view of a package structure in accordance with the second embodiment of the present invention.

FIG. 3F is a cross-sectional view of a package structure in accordance with the first embodiment of the present invention. The package structure 302 includes a package substrate 310, at least an active component 304, at least a passive component 330, a plurality of passive component electrode planes 312 and 314, and a solder mask layer 320. The passive component electrode plane 312 and 314 are disposed on the surface of the substrate 310 for electrically connecting the corresponding passive component 330. In addition, the active device 304, for example, is electrically connected to the substrate 310 by a plurality of wires 306 or by a flip chip. The passive component 330, such as a capacitor, is on the surface of the package substrate 310 and each passive component 330 has a plurality of electrodes 332 and 334. The solder mask layer 320 covers the surface of the package substrate 310 and includes a solder mask opening 322. The solder mask opening 322 exposes a portion of the surface of each of the corresponding passive component electrode planes 312 and 314. Then an encapsulant 328 is formed to cover the surface of the active component 304 and/or the passive component 330 to complete a package structure 302. The bottom surface of the package substrate 310 can further comprise a plurality of solder balls 340 to connect the external device (not shown) forming a ball grid array (BGA) package structure 302.

In light of the above, the circuit carrier and the package structure thereof have the following advantages.

1. Because there is no solder mask layer between the bottom of the passive component and the substrate, the gap between the passive component and the substrate can be rendered wider. Therefore, the remaining flux can be easily removed in the cleaning step. In addition, during the subsequent high temperature process such as reflow process, the entry of the solders in the gap will be more difficult, and thereby avoiding short-circuit due to undesirable connection between the remaining flux and the subsequent flux and thus the yield rate can be effectively increased.

2. With respect to the alignment preciseness of the solder mask opening, the area of the passive component solder mask opening of the present invention is larger than the perimeter scope of the corresponding passive component electrode pads or larger than the exposed area of the corresponding passive component electrode planes. Hence, the manufacturing equipment with less alignment preciseness can be used to form the solder mask opening. Thus, the production cost of the circuit carrier can be reduced.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A circuit carrier, for carrying at least a passive component, said passive component having a plurality of electrodes, said circuit carrier comprising:
   a substrate, having a surface;
   a plurality of passive component electrode pads, formed on said surface of said substrate for respectively connecting said electrodes of said passive component; and
   a solder mask layer, covering said surface of said substrate, said solder mask layer including at least a solder mask opening, wherein one of said solder mask opening is corresponding to one of said passive component and entirely exposing said plurality of passive component electrode pads corresponding to said passive component;
   wherein said solder mask layer is not disposed on the region between the passive component electrode pads.

2. The circuit carrier of claim 1, wherein said circuit carrier is an IC package carrier.

3. The circuit carrier of claim 1, wherein said solder mask opening further exposes a portion of a conductive line on said surface connected to said passive component electrode pad.

4. The circuit carrier of claim 1, further comprising at least a passive component disposed on said surface of said substrate.

5. The circuit carrier of claim 1, wherein said passive component is at least one of a resistor, a capacitor or an inductor.

6. A package structure comprising:
   a package substrate having a surface;
   at least an active component, electrically connected to said package substrate;
   at least a passive component on said surface of said package substrate, said passive component having a plurality of electrodes;
   a plurality of passive component electrode pads, formed on said surface of said package substrate for respectively connecting said passive component electrodes; and
   a solder mask layer, covering said surface of said package substrate, said solder mask layer including at least a solder mask opening, wherein one of said solder mask opening is corresponding to one of said passive component and entirely exposing said plurality of passive component electrode pads corresponding to said passive component;
   wherein said solder mask layer is not disposed the region between the passive component electrode pads.

7. The package structure of claim 6, further comprising an encapsulant covering said passive component.

8. The package structure of claim 6, wherein said surface of said package substrate includes a top surface connected to said active component and a bottom surface corresponding to said top surface.

9. The package structure of claim 6, wherein said passive component is at least one of a resistor, a capacitor or an inductor.

10. The package structure of claim 6, wherein said solder mask opening further exposes a portion of a conductive line on said surface connected to said passive component electrode pad.

11. A circuit carrier, for carrying at least a passive component, said passive component having a plurality of electrodes, said circuit carrier comprising:
- a substrate, having a surface;
- a plurality of passive component electrode planes, formed on said surface of said substrate, for respectively connecting said electrodes of said passive component; and
- a solder mask layer, covering said surface of said substrate, said solder mask layer including at least a solder mask opening, wherein one of said solder mask opening is corresponding to one of said passive component and exposing a portion of the surface of each of said plurality of passive component electrode planes corresponding to said passive component;
- wherein said solder mask layer is not disposed on the region between the passive component electrode planes.

12. The circuit carrier of claim 11, wherein said circuit carrier is an IC package carrier.

13. The circuit carrier of claim 11, wherein said plurality of passive component electrode plane has an opening at a corner of said solder mask opening.

14. The circuit carrier of claim 11, wherein said plurality of passive component electrode plane has an opening at an edge of said solder mask opening.

15. The circuit carrier of claim 11, wherein said passive component is at least one of a resistor, a capacitor or an inductor.

16. A package structure comprising:
- a package substrate having a surface;
- at least an active component, electrically connected to said package substrate;
- at least a passive component on said surface of said package substrate, said passive component having a plurality of electrodes;
- a plurality of passive component electrode planes, formed on said surface of said package substrate, for respectively connecting said passive component electrodes; and
- a solder mask layer, covering said surface of said package substrate, said solder mask layer including at least a solder mask opening, wherein one of said solder mask opening is corresponding to one of said passive component and exposing a portion of the surface of each of said plurality of passive component electrode planes corresponding to said passive component;
- wherein said solder mask layer is not disposed on the region between the passive component electrode planes.

17. The package structure of claim 16, further comprising an encapsulant covering said passive component.

18. The package structure of claim 16, wherein said passive component is at least one of a resistor, a capacitor or an inductor.

19. The package structure of claim 16, wherein said plurality of passive component electrode plane has an opening at a corner of said solder mask opening.

20. The package structure of claim 16, wherein said plurality of passive component electrode plane has an opening at an edge of said solder mask opening.

* * * * *